(12) United States Patent
Decesaris et al.

(10) Patent No.: US 9,703,623 B2
(45) Date of Patent: Jul. 11, 2017

(54) ADJUSTING THE USE OF A CHIP/SOCKET HAVING A DAMAGED PIN

(71) Applicant: LENOVO ENTERPRISE SOLUTIONS (SINGAPORE) PTE. LTD., Singapore (SG)

(72) Inventors: Michael Decesaris, Carrboro, NC (US); Luke D. Remis, Raleigh, NC (US); John K. Whetzel, Holly Springs, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/538,216

(22) Filed: Nov. 11, 2014

(65) Prior Publication Data
US 2016/0132383 A1 May 12, 2016

(51) Int. Cl.
*G01R 31/26* (2014.01)
*G01R 31/02* (2006.01)
*G01R 31/303* (2006.01)
*G06F 11/07* (2006.01)
*G06F 11/263* (2006.01)

(52) U.S. Cl.
CPC ........ *G06F 11/0793* (2013.01); *G01R 31/303* (2013.01); *G06F 11/0706* (2013.01); *G06F 11/0751* (2013.01); *G06F 11/079* (2013.01)

(58) Field of Classification Search
CPC ............ G01N 21/95684; G01R 31/046; G01R 31/02; G01R 31/311
USPC .......... 438/530; 324/750.07, 750.23, 754.18, 324/756.02, 759.03, 762.02; 348/46; 382/141–147
See application file for complete search history.

(56) References Cited

U.S. PATENT DOCUMENTS 4,696,047 A 9/1987 Christian et al.
6,040,703 A * 3/2000 Kimball ............... G01M 7/027
324/756.02

(Continued)

FOREIGN PATENT DOCUMENTS

EP 1079420 A2 2/2001
EP 1089229 A2 4/2001
WO 2005116670 A1 12/2005

OTHER PUBLICATIONS

I. Edinbarough et al, "A Vision and Robot Based On-Line Inspection Monitoring System for Electronic Manufacturing" Computers in Industry, vol. 56(8-9), pp. 986-996, 2005.

*Primary Examiner* — Kimberly Rizkallah
*Assistant Examiner* — Brian Turner
(74) *Attorney, Agent, or Firm* — Law Office of Jim Boice

(57) ABSTRACT

An electronic system comprises: a pin sensor; and an integrated management module, wherein the integrated management module: identifies a location of a damaged connector between a semiconductor chip and a hardware socket, wherein the location of the damaged connector is described by one or more readings from the pin sensor, and wherein the damaged connector prevents a particular signal from being supplied to the semiconductor chip via the hardware socket; identifies the particular signal as an input for a particular semiconductor function; determines whether the semiconductor chip provides the particular semiconductor function; and adjusts a use of the semiconductor chip based on whether or not the semiconductor chip uses the particular signal to provide the particular semiconductor function.

19 Claims, 5 Drawing Sheets

(56) References Cited

U.S. PATENT DOCUMENTS

| | | | |
|---|---|---|---|
| 6,400,134 B1* | 6/2002 | Schuntermann | G01R 1/0433 324/538 |
| 6,445,201 B1* | 9/2002 | Simizu | G01R 1/0483 324/750.02 |
| 6,512,387 B1* | 1/2003 | Bohn | G01R 31/046 324/762.02 |
| 7,755,376 B2 | 7/2010 | Ding | |
| 2004/0064723 A1* | 4/2004 | Barnes | G06F 12/1491 726/1 |
| 2005/0024220 A1* | 2/2005 | Shidla | G01R 31/2818 340/652 |
| 2005/0084148 A1 | 4/2005 | Miranda | |
| 2005/0151841 A1 | 7/2005 | Nelson et al. | |
| 2005/0259861 A1 | 11/2005 | Nomoto et al. | |
| 2006/0018530 A1 | 1/2006 | Oaki et al. | |
| 2007/0080703 A1* | 4/2007 | Ding | G01N 21/95684 324/750.07 |
| 2008/0258704 A1* | 10/2008 | Ryskoski | G01R 1/0433 324/66 |
| 2009/0251978 A1* | 10/2009 | Gorman | H03K 19/018557 365/200 |
| 2010/0060310 A1* | 3/2010 | Laisne | H01L 25/0657 326/10 |
| 2013/0212427 A1* | 8/2013 | Franceschini | G11C 29/56008 714/6.13 |

* cited by examiner

US 9,703,623 B2

ADJUSTING THE USE OF A CHIP/SOCKET HAVING A DAMAGED PIN

BACKGROUND

The present disclosure relates to the field of electronic devices, and specifically to electronic devices such as semiconductor chips that mate with sockets mounted on a printed circuit board. Still more particularly, the present disclosure relates to damaged pins that electrically couple semiconductor chips to sockets.

Bent or damaged central processing unit (CPU) pins from the CPU, and/or damaged/obstructed CPU pin fields on a socket, can cause havoc with server administration. Bent/damaged pins can introduce errors into the system that can be difficult to debug, since problems caused by the bent/damaged pins often appear intermittently and, in some cases, long after the CPU was initially installed (mated with the socket). Pins can be damaged when a user swaps or adds CPUs to a system. During such operations, foreign objects can be dropped onto the pins, the pins can be physically grabbed by the user, etc., thus bending/damaging the pin(s).

SUMMARY

In an embodiment of the present disclosure, an electronic system comprises: a pin sensor; and an integrated management module, wherein the integrated management module: identifies a location of a damaged connector between a semiconductor chip and a hardware socket, wherein the location of the damaged connector is described by one or more readings from the pin sensor, and wherein the damaged connector prevents a particular signal from being supplied to the semiconductor chip via the hardware socket; identifies the particular signal as an input for a particular semiconductor function; determines whether the semiconductor chip provides the particular semiconductor function; and adjusts a use of the semiconductor chip based on whether or not the semiconductor chip uses the particular signal to provide the particular semiconductor function.

In an embodiment of the present disclosure, a method and/or computer program product manages a use of a semiconductor chip. An image analysis hardware device identifies a location of a damaged connector between a semiconductor chip and a hardware socket, wherein the location of the damaged connector is depicted on an image captured by a camera and received by the image analysis hardware device, and wherein the damaged connector prevents a particular signal from being supplied to the semiconductor chip via the hardware socket. One or more processors identify the particular signal as an input for a particular semiconductor function. One or more processors determine whether or not the semiconductor chip provides the particular semiconductor function. One or more processors adjust a use of the semiconductor chip based on whether or not the semiconductor chip uses the particular signal to provide the particular semiconductor function.

DETAILED DESCRIPTION

Figure 1:
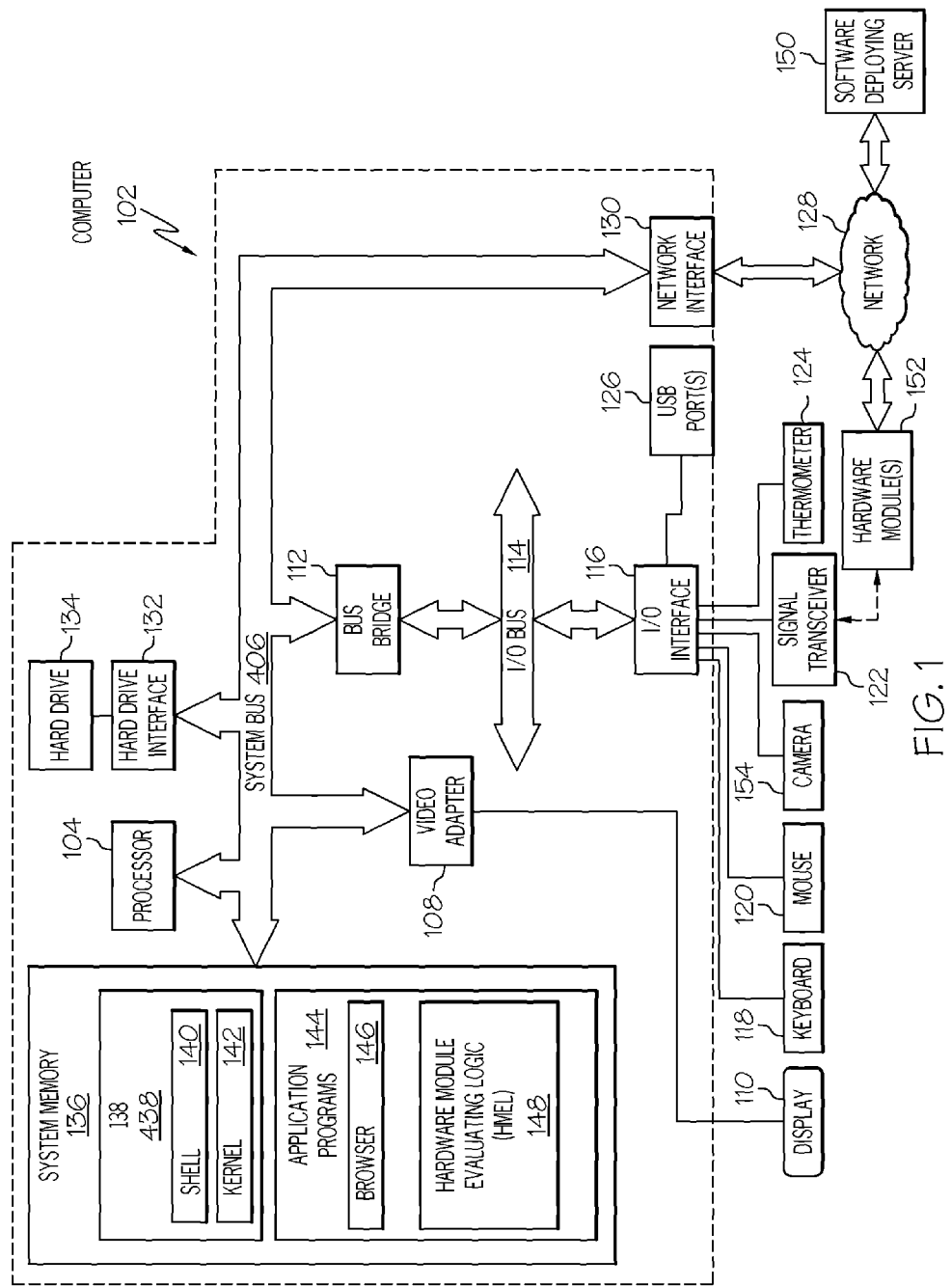
FIG. 1 depicts an exemplary system and network which may be used to implement the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

With reference now to the figures, and in particular to FIG. 1, there is depicted a block diagram of an exemplary system and network that may be utilized by and/or in the implementation of the present invention. Note that some or all of the exemplary architecture, including both depicted hardware and software, shown for and within computer 102 may be utilized by software deploying server 150 and/or hardware module(s) 152, as well as blades 204a-204n and/or service processor 208 depicted in FIG. 2 and/or FIG. 3, as well as smart phone 312 depicted in FIG. 3.

Exemplary computer 102 includes a processor 104 that is coupled to a system bus 106. Processor 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a signal transceiver 122 (which may include electronic transmitters/receivers for near field communication, infrared, radio frequency, and/or other short range communication signals), a hardware thermometer 124, external USB port(s) 126, and/or a camera 154. While the format of the ports connected to I/O interface 116 may be any known to those skilled in the art of computer architecture, in one embodiment some or all of these ports are universal serial bus (USB) ports.

As depicted, computer 102 is able to communicate with a software deploying server 150 using a network interface 130. Network interface 130 is a hardware network interface, such as a network interface card (NIC), etc. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In one embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and/or other computer systems.

Application programs 144 in computer 102's system memory (as well as software deploying server 150's system memory) also include a Hardware Module Evaluating Logic (HMEL) 148. HMEL 148 includes code for implementing the processes described below, including those described and/or referenced in FIGS. 2-5. In one embodiment, computer 102 is able to download HMEL 148 from software deploying server 150, including in an on-demand basis, wherein the code in HMEL 148 is not downloaded until needed for execution. Note further that, in one embodiment of the present invention, software deploying server 150 performs all of the functions associated with the present invention (including execution of HMEL 148), thus freeing computer 102 from having to use its own internal computing resources to execute HMEL 148.

Note that the hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Figure 2:
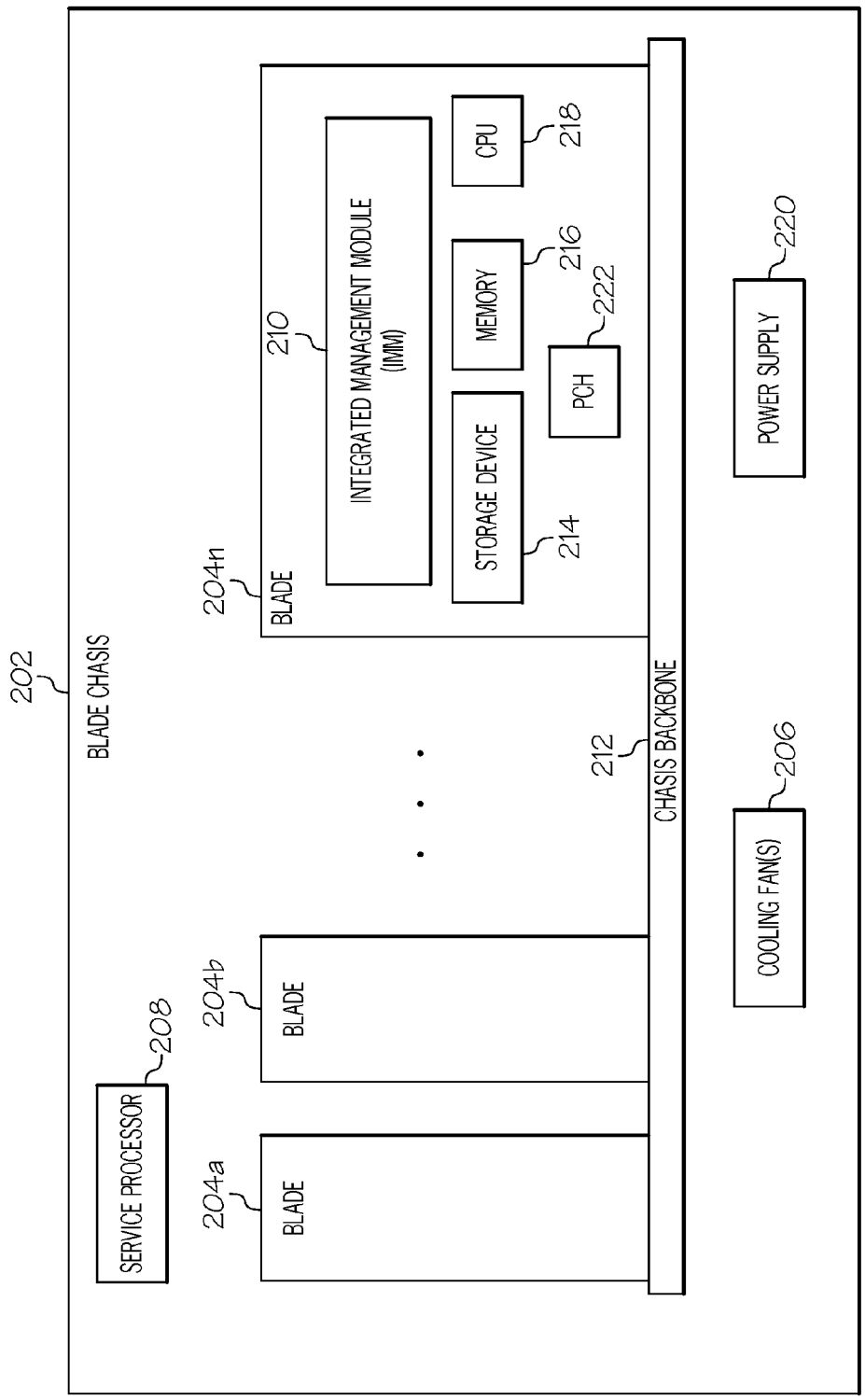
FIG. 2 illustrates an exemplary blade chassis in which the present invention may be implemented.

With reference now to FIG. 2, an exemplary blade chassis 202 in which the present invention may be implemented is presented. Blade chassis 202 includes multiple blades 204a-204n (where "n" is an integer). Each of the blades 204a-204n is a server (e.g., having an architecture that utilizes some or all of the architecture shown for computer 102 in FIG. 1) that is physically and electrically connected to a chassis backbone 212. The chassis backbone 212 provides power from a power supply 220 to the blades 204a-204n, as well as a data pathway for transmitting data among the blades 204a-204n and/or to outside sources (e.g., a network to other resources, not shown). Cooling fan(s) 206 provide cooling to the entire blade chassis 202, and/or to specific blades and/or one or more components (e.g., a central processing unit—CPU 218) of a specific blade. Each blade from blades 204a-204n also has other components, such as a storage device 214, a memory 216, and a platform control hub (PCH) 222.

Each blade from blades 204a-204n is managed by an integrated management module (IMM) 210. IMM 210, which may be devoted to a particular blade (as shown) or to multiple blades from the blades 204a-204n, is a combination hardware device that performs (and replaces) the functions of a service processor and a baseboard management controller.

A service processor (which the IMM 210 replaces) is a hardware-based processor, also known as a management processor, that works with hardware instrumentation and systems management software to provide problem notification and resolution. Service processors also allow different blades from blades 204a-204n to communicate among themselves and with outside resources (such as the smart phone 312 shown in FIG. 3).

A baseboard management controller (which the IMM 210 also replaces) is a specialized microcontroller on a motherboard, such as that found in blade 204n. For example, a baseboard management controller (and thus IMM 210) manages an interface between system management software within blade 204n and platform hardware found within blade 204n. Thus, hardware sensors (not depicted) within blade 204n, which report on statuses/parameters such as temperature, cooling fan speeds, power status, local Operating System (OS) statuses, etc., provide information describing operations of the blade 204n. In other words, the baseboard management controller (and thus IMM 210) is a specialized microcontroller that manages the overall health and environment of a blade such as blade 204n. This management includes the monitoring of cooling fans, power supplies, other hardware devices, as well as operations of components of blade 204n, such as CPU 218, memory 216, storage device 214, etc.

Also within exemplary blade 204n is the platform control hub (PCH) 222. PCH 222 is a hardware chip that controls data paths, clocking, interfaces, etc. for one or more electronic components of blade 204n, including but not limited to storage device 214, memory 216, and/or CPU 218, all under the management of the IMM 210. Thus, each of these components is capable of being selectively throttled back by a throttle signal directly issued by the PCH 222. In an embodiment of the present invention, this throttling and/or control is provided indirectly by directions from the IMM 210 to the PCH 222, which throttles operations of CPU 218 by reducing a clock speed of the CPU 218, and/or by throttling operations of CPU 218 adjusting a throughput of operations performed by CPU 218. In an embodiment, some or all of these throttling operations are performed directly by the IMM 210, without the intervention of the PCH 222.

IMM 210 and/or PCH 222 also are capable of adjusting operations of storage device 214 and/or memory 216 by adjusting the read/write speed for read/write operations performed by storage device 214 and/or memory 216.

A service processor 208 coordinates the operations of the blades 204a-204n, such as distributing power from the power supply 220 to the various blades 204a-204n, adjusting the speed of the cooling fan(s) 206 mounted on the blade chassis 202, etc. Thus, service processor 208 may be analogous to computer 102 in FIG. 1, thereby managing blades 204a-204n, and/or more specifically CPUs 218 within the blades 204a-204n, which are analogous to hardware module(s) 152 shown in FIG. 1.

Figure 3:
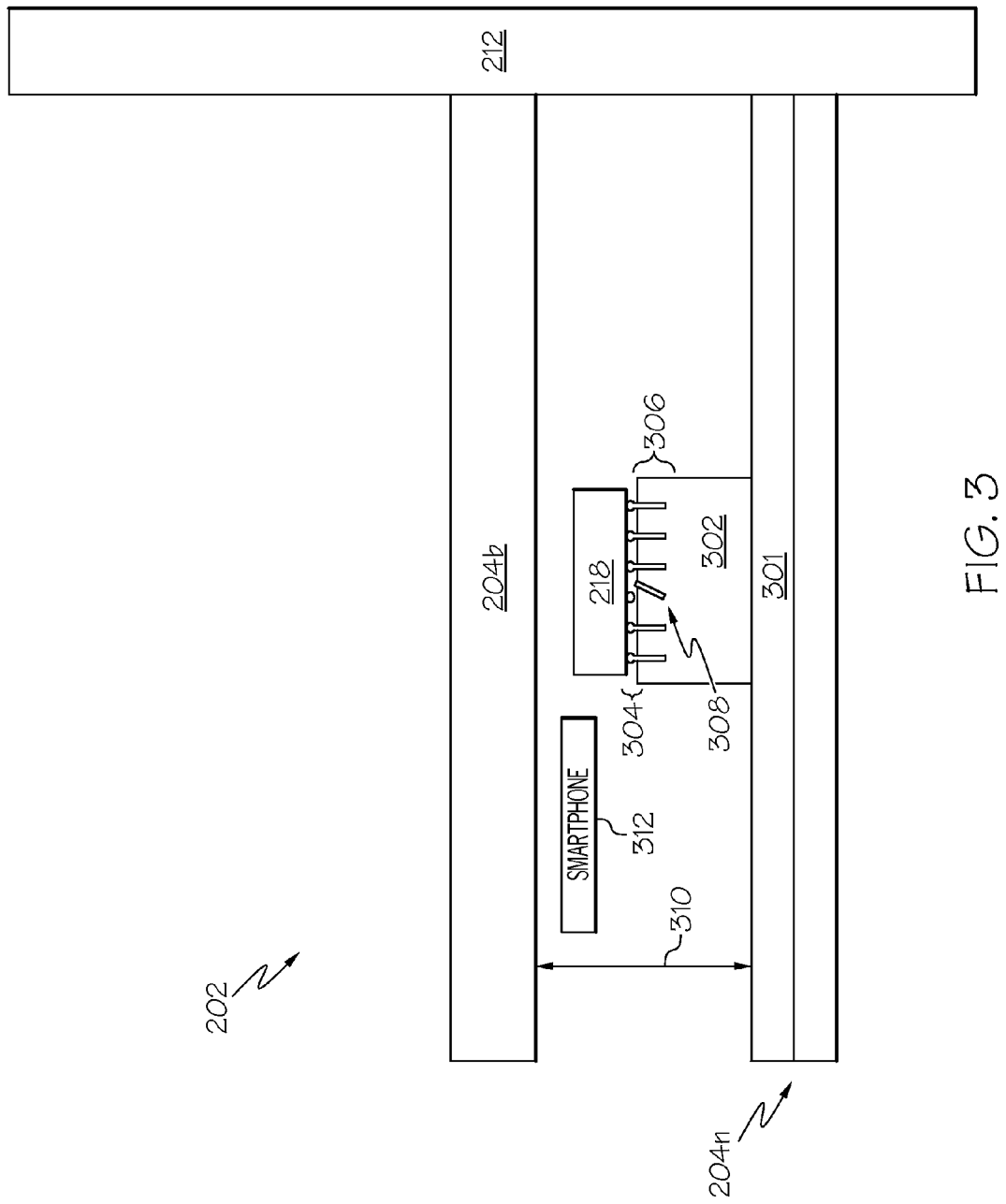
FIG. 3 depicts additional detail of the blade chassis illustrated in FIG. 2.

With reference now to FIG. 3, additional detail of the blade chassis 202 illustrated in FIG. 2 is presented. As shown in FIG. 3, there is a limited amount of physical space between blade 204b and blade 204n, as shown by line 310. As such, there is limited room within which to work if a problem arises.

For example, consider a socket 302, to which the CPU 218 from FIG. 2 is mounted. In one embodiment, pins emanate from the bottom of CPU 218, and are inserted into holes in the socket 302, which 1) secure the CPU 218 to the motherboard 301, and 2) provide electrical communication to data/power pathways to other blades, resources, power supplies, etc. In the depicted embodiment however, the situation is reversed, such that pins 306 emanate upwards from the socket 302, and merely press against connectors 304 on the bottom of the CPU 218 in order to make electrical contact. The CPU 218 is secured to the socket 302 by indentations (not shown) on the top of the socket 302 and a securing mechanism/lever (also not shown). The present invention is useful in either embodiment (i.e., where pins emanate from the CPU 218 or from the socket 302).

The embodiment depicted in FIG. 3 provides the benefit of reducing the chance of pins (e.g., pins 306) being damaged (i.e., bent, broken, etc.). However, a drawback to the embodiment depicted in FIG. 3 is that it is more difficult for a user to visually detect (with the naked eye) any damage to the pins 306, particularly in a limited work space as that shown by line 310. However, there is enough room available, including when CPU 218 is not yet installed on the socket 302, for an electronic camera-enabled device (e.g., smart phone 312) to be positioned within the blade 204*n* and the blade 204*b*, in order to photograph (or otherwise capture a visual image thereof, as in a video stream, etc.) the top of the socket 302 and the pins 306.

As depicted within FIG. 3, pin 308 from pins 306 is defective. In the depicted example in FIG. 3, pin 308 is bent. Whether bent or broken or otherwise defective/deformed, electrical communication between pin 308 and one of the connectors 304 from CPU 218 has been broken/disrupted. Various embodiments of the present invention determine what, if any, harm this broken connection causes, and determine what, if any, remediation should be taken. In order to makes these two determinations, the function of the broken pin 308 is established by determining what, if any, utility is provided by the signal that should have been communicated by the broken pin 308. In order to make the determinations, the present invention maps the pins 306 from the socket 302 to the connectors 304 on the CPU 218 to functions/components of the CPU 218.

Figure 4:
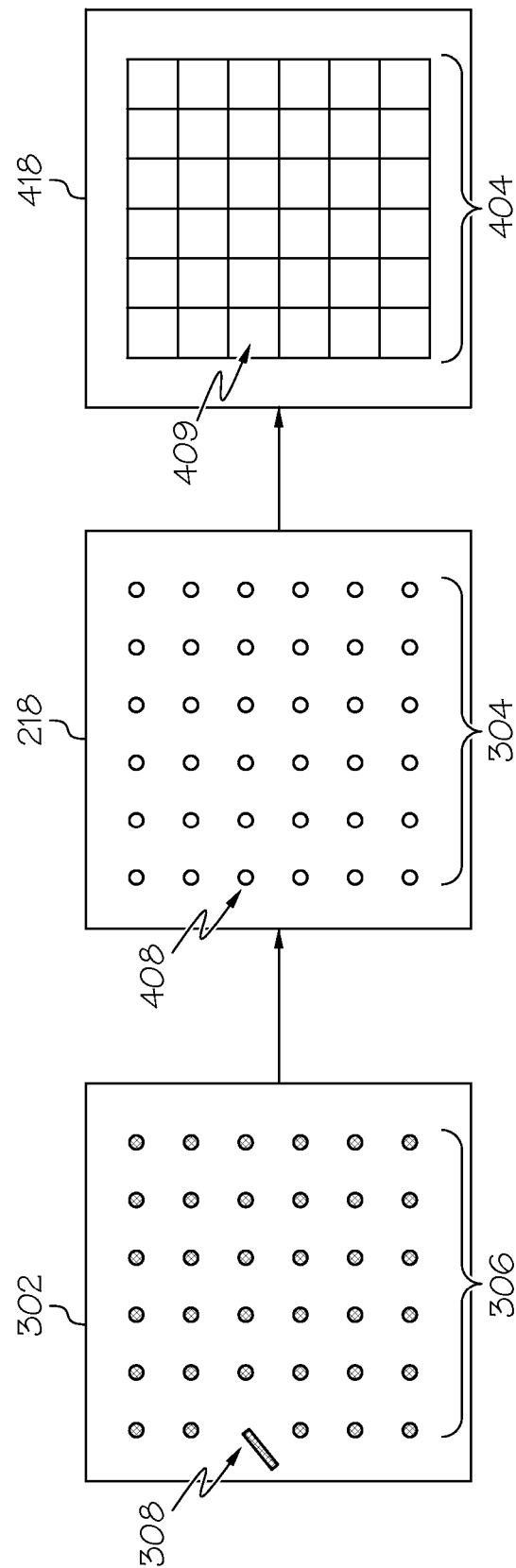
FIG. 4 illustrates a mapping of socket pins to connectors on an integrated circuit (IC) chip to a functionality matrix of functions provided by the IC chip.

With reference now to FIG. 4, a mapping of socket pins to connectors to functions/components is presented with the use of a functionality matrix 418 of functions provided by the IC chip (e.g., CPU 218). In FIG. 4, the top of socket 302 shows the array of pins 306, including the defective pin 308 from FIG. 3. Pins 306 are physically configured to match up with connectors 304 on the bottom of CPU 218, as shown in FIG. 2 and FIG. 3. In an embodiment of the present invention, the connectors 304 are a ball grid array (BGA) of connectors, which make electrical contact with corresponding pins from pins 306 when the two are pressed together. As shown in FIG. 4, each of the connectors 304 is mapped to a functionality matrix 418 composed of an array of cells 404. For example, cell 409 corresponds to connector 408, which corresponds to broken pin 308. Content in cell 409 is from a table of functionalities provided by CPU 218.

For example, assume that connector 408 is designed to receive power to CPU 218. Cell 409 would therefore represent the function of providing power to CPU 218 (e.g., to a power bus within the CPU 218). In this scenario, connector 408 and the function described in cell 409 are likely to be considered critical to the usefulness of CPU 218, since powering up the power bus within the CPU 218 is likely to be critical to the overall operation of the CPU 218. However, in another scenario, connector 408 may be designed to provide data for a less critical function described in cell 409, such as enabling a display to show a certain hue/tint. If connector 408 is broken, then the effectiveness of CPU 218 and/or the system display that it supports will be only marginally compromised, if at all. In another scenario, connector 408 may be a "dummy" connector that is not used by CPU 218. In this last scenario, the damage to pin 308 has no impact on the operation of CPU 218 at all.

Therefore, the present invention 1) uses photo recognition hardware to evaluate a photograph (or other visual image) of the pins 306 and/or connectors 304 in a socket 302/CPU 218, 2) determines, by one or more processors examining the functionality matrix 418, what impact any particular broken pin/connector may have on the functionality of the CPU 218, and 3) adjusts, by an integrated management module (IMM) and/or service processor and/or a PCH, the configuration of the CPU 218 in order to compensate for the broken pin/connector.

As depicted in FIG. 1-FIG. 4, one or more embodiments of the present invention present an electronic system comprising a camera (e.g., the camera 154 in FIG. 1 within a smart phone such as the smart phone 312 shown in FIG. 3); and an integrated management module (e.g., IMM 210 in FIG. 2 or, alternatively, the service processor 208 shown in FIG. 2). In an embodiment of the present invention, the camera 154/smart phone 312 and the IMM 210/service processor 208 are able to communicate wirelessly using signal transceivers, such as signal transceiver 122 shown in FIG. 1 (assuming that the smart phone 312 and the blade 204*n* in FIG. 3 both have signal transceivers). In an embodiment of the present invention, communication between the camera 154/smart phone 312 is via a hard wired management network, which includes the IMM 210/service processor 208 (i.e., a baseboard management controller—BMC). In an embodiment of the present invention, access to the hard wired management network is afforded the smart phone 312 by the smart phone 312 plugging directly into the hard wired management network.

The integrated management module identifies a location of a damaged connector between a semiconductor chip, such as CPU 218 shown in the figures, and a hardware socket (e.g., socket 302 shown in FIG. 3 and FIG. 4). The location of the damaged connector (e.g., pin 308 shown in FIG. 3 and FIG. 4) is depicted on a photo (preferably in a digital format) that has been taken by the camera. As described herein, the damaged connector prevents a particular signal from being supplied to the semiconductor chip via the hardware socket.

The IMM also identifies the particular signal as an input for a particular semiconductor function. For example, a particular pin may provide power, data, a clock, etc. that is used by circuitry within the CPU.

The IMM determines whether the semiconductor chip provides the particular semiconductor function (e.g., by using specific circuitry). The IMM then adjusts a use of the semiconductor chip based on whether or not the semiconductor chip uses the particular signal to provide the particular semiconductor function.

In an embodiment of the present invention, the integrated management module also, in response to determining that the semiconductor chip uses the particular signal to provide the particular semiconductor function, issues an instruction to repair the damaged connector. Thus, an instruction may be issued directing the user to straighten, re-solder, etc. a damaged pin.

In an embodiment of the present invention, the integrated management module, in response to determining that the semiconductor chip uses the particular signal to provide the particular semiconductor function, issues an instruction to the user to replace the hardware socket, rather than trying to fix just the broken pin.

In an embodiment of the present invention, the integrated management module, in response to determining that the semiconductor chip uses the particular signal to provide the particular semiconductor function, issues an instruction to the user to replace the semiconductor chip. For example, if the socket is unable to accommodate all of the needs of a particular CPU, then another CPU may be used instead. This solution is especially useful if another CPU has different pin connections (e.g., ball grid array connectors), such that the broken pin from the socket is irrelevant to the CPU's functionality.

In an embodiment of the present invention, the integrated management module, in response to determining that the semiconductor chip uses the particular signal to provide the particular semiconductor function, disables the particular semiconductor function in the semiconductor chip. For example, the IMM, upon determining that the broken pin in the socket will prevent clock signals from reaching the CPU, may disable a data bus that depends on that clock signal.

In an embodiment of the present invention, the integrated management module, in response to determining that the particular signal is a null signal, issues an instruction to the semiconductor chip to enable the semiconductor chip. For example, the signal being transmitted via the broken pin may actually be no signal at all (i.e., no power supply, no data, no clock, etc.). Therefore, the broken pin has no utility anyway, and thus the CPU is enabled without any reduction in capability.

In an embodiment of the present invention, the integrated management module, in response to determining that the particular signal is not used by the semiconductor chip, issues an instruction to enable the semiconductor chip. For example, the signal may in fact be a power supply, data, a clock signal, etc., but this particular CPU doesn't ever use that signal anyway. That is, the broken pin from the socket may be designed to read data from an L3 cache, but this particular CPU may not use (or even have) an L3 cache. Thus, the loss of the broken pin has no impact on the CPU's performance, and the CPU is therefore enabled with no degradation in performance.

In an embodiment of the present invention, the integrated management module, in response to determining that the particular signal is used by a functional logic within the semiconductor chip, issues an instruction to the semiconductor chip to alter the functional logic within the semiconductor chip.

For example, the broken pin may be an input/output (I/O) pin, utilizing a particular signal for reading data from a first L2 cache in the core of the CPU. Since this data cannot flow through the broken connection/pin, then the CPU will heal itself by directing the core to utilize a second L2 cache in the core of the CPU, thus no longer needing to use the first L2 cache. Thus, in this embodiment/example, the functional logic provides access to specific memory devices.

In an embodiment of the present invention, the semiconductor chip is on a motherboard that is populated by other semiconductor chips. The particular signal that was to be transmitted via the (now broken/bent) pin describes a temperature of the semiconductor chip (e.g., using the thermometer 124 shown in FIG. 1). The functional logic (e.g., the PCH 222 shown in FIG. 2) adjusts power usage on the semiconductor chip, either directly or with the aid of the integrated management module. Through the direct use of the PCH 222 or the use of PCH 222 with the IMM 210 shown in FIG. 2, temperature readings are taken from the other semiconductor chips on the same motherboard as the CPU that is coupled to the socket with the broken pin. The IMM/PCH then adjusts the power usage on the CPU based on the temperature readings from the other semiconductor chips/CPUs on the motherboard. That is, if one or more other CPUs are operating at a particular temperature, then an assumption is made that the CPU that is mounted on the socket with the broken pin is operating at that same temperature. Therefore, any changes to a fan (e.g., on a heat sink above the CPU) speed for heat-sink fans on the other CPUs on the motherboard will be mirrored by the heat-sink fan used by the CPU that has the broken pin/connection.

Figure 5:
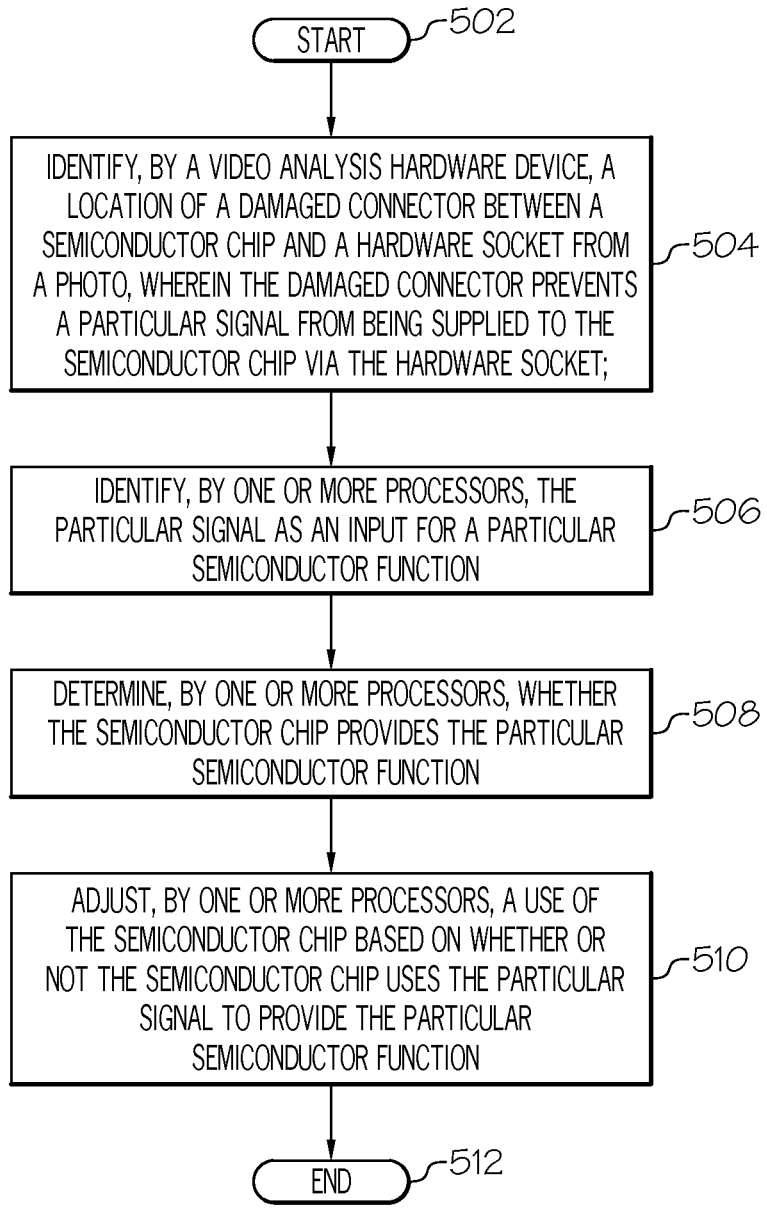
FIG. 5 is a high level flow chart of one or more exemplary steps taken by one or more processors and/or other hardware devices to adjust to a bent connector between an IC chip and a socket.

With reference now to FIG. 5, a high level flow chart of one or more exemplary steps taken by one or more processors and/or other hardware devices to adjust to a damaged connection between an IC chip and a socket is presented.

After initiator block 502, a video analysis hardware device (e.g., computer 102 shown in FIG. 1) identifies a location of a damaged connector between a semiconductor chip and a hardware socket, as described in block 504. The computer 102, executing image recognition software within HMEL 148, identifies the location of the damaged connector (which prevents a particular signal from being supplied to the semiconductor chip via the hardware socket).

As described in block 506, one or more processors (e.g., running HMEL 148) identify the particular signal as an input for a particular semiconductor function. For example, components (i.e., cache, off-chip memory such as DIMMs, video processors, etc.) of a CPU are associated with certain connectors/pins, which provide input/output functionality for these components. This correlation of a particular pin/connector is made by logic within the processors (e.g., the service processor 208 and/or the IMM 210 shown in FIG. 2).

As described in block 508, one or more processors determine whether the semiconductor chip provides the particular semiconductor function. If so, then one or more processors adjust a use of the semiconductor chip based on whether or not the semiconductor chip uses the particular signal to provide the particular semiconductor function (block 510). The flowchart ends at terminator block 512.

In an embodiment of the present invention, the method further comprises, in response to determining that the semiconductor chip uses the particular signal to provide the particular semiconductor function, predicting, by one or more processors, an impact that an absence of the particular signal will have on functionalities provided by the semiconductor chip; and storing predicted impacts on the semiconductor chip caused by the absence of the particular signal in an event log. For example, if the system determines that the broken pin/connector will affect/impact the operation of a CPU, then this impact will be logged in an event log, which can later be analyzed by the system to determine what corrective actions, if any, should be taken.

In an embodiment of the present invention, the method further comprises, in response to determining that the semiconductor chip uses the particular signal to provide the particular semiconductor function, issuing, by one or more processors, an instruction to replace the hardware socket.

In an embodiment of the present invention, the method further comprises, in response to determining that the semiconductor chip uses the particular signal to provide the particular semiconductor function, issuing, by one or more processors, an instruction to replace the semiconductor chip.

In an embodiment of the present invention, the method further comprises, in response to determining that the semiconductor chip uses the particular signal to provide the particular semiconductor function, disabling, by one or more processors, the particular semiconductor function in the semiconductor chip.

In an embodiment of the present invention, the method further comprises, in response to determining that the particular signal is a null signal, enabling, by one or more processors, the semiconductor chip.

In an embodiment of the present invention, the method further comprises, in response to determining that the particular signal is not used by the semiconductor chip, enabling, by one or more processors, the semiconductor chip.

In an embodiment of the present invention, the method further comprises, in response to determining that the particular signal is used by the semiconductor chip, adjusting, by one or more processors, functional logic within the semiconductor chip.

In an embodiment of the present invention, the semiconductor chip is on a board that is populated by other semiconductor chips, the particular signal describes a temperature of the semiconductor chip, the functional logic adjusts power usage on the semiconductor chip, and the method further comprises: receiving temperature readings from the other semiconductor chips; and directing the functional logic, as altered by the integrated management module, to adjust the power usage on the semiconductor chip based on the temperature readings from the other semiconductor chips.

While the present invention has been described in an embodiment in which components on a blade in a blade chassis are examined (e.g., see FIG. 3), the present invention is useful in any confined space environment for electronic components, such as rack units, etc. Furthermore, use of the present invention to identify bent connectors is also useful in environments that are not physically confined. That is, even if the view of a component on a board is unobstructed (e.g., while sitting on a test bench), it is still difficult for the naked eye to recognize a pin that is not perfectly straight. In various embodiments of the present invention, a camera and image processing software is able to identify any connectors that are bent, unaligned, etc.

While the present invention has been described in an embodiment of using a camera to detect the location of bent/damaged connector pins, in an embodiment of the present invention, this detection is performed using other types of pin sensors. For example, in one embodiment, the pin sensor is a pressure sensor embedded in the hardware socket and/or the semiconductor chip. If a pin is not bent, then there is no pressure exerted against one or more such pressure sensors. However, if a pin is bent, then one or more or such pressure sensors will be contacted, thus indicating 1) a bent pin and 2) the location of the bent pin.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the invention of the present application in detail and by reference to illustrative embodiments thereof, it will be apparent that modifications and variations are possible without departing from the scope of the invention defined in the appended claims.

What is claimed is:

1. An electronic system comprising:
a pin sensor; and
an integrated management module, wherein the integrated management module comprises:
    means for identifying a location of a damaged connector between a semiconductor chip and a hardware socket, wherein the location of the damaged connector is described by a reading from the pin sensor, and wherein the damaged connector prevents a particular signal from being supplied to the semiconductor chip via the hardware socket;
    means for identifying the particular signal as an input for a particular semiconductor function;
    means for determining whether the semiconductor chip provides the particular semiconductor function; and
    means for adjusting a functionality of the semiconductor chip based on whether or not the semiconductor chip uses the particular signal to provide the particular semiconductor function.

2. The electronic system of claim 1, wherein the pin sensor is a camera, and wherein the reading from the pin sensor is a video image of the damaged connector.

3. The electronic system of claim 1, wherein the pin sensor is a pressure sensor, and wherein the reading from the pin sensor is a pressure reading caused by the damaged connector contacting the pin sensor.

4. The electronic system of claim 1, wherein the integrated management module further comprises:
    means for, in response to determining that the semiconductor chip uses the particular signal to provide the particular semiconductor function, issuing an instruction to repair the damaged connector.

5. The electronic system of claim 1, wherein the integrated management module further comprises:
    means for, in response to determining that the semiconductor chip uses the particular signal to provide the particular semiconductor function, issuing an instruction to replace the hardware socket.

6. The electronic system of claim 1, wherein the integrated management module further comprises:
    means for, in response to determining that the semiconductor chip uses the particular signal to provide the particular semiconductor function, issuing an instruction to replace the semiconductor chip.

7. The electronic system of claim 1, wherein the integrated management module further comprises:

means for, in response to determining that the semiconductor chip uses the particular signal to provide the particular semiconductor function, disabling the particular semiconductor function in the semiconductor chip.

8. The electronic system of claim 1, wherein the integrated management module further comprises:
means for, in response to determining that the particular signal is a null signal, issuing an instruction to the semiconductor chip to enable the semiconductor chip.

9. The electronic system of claim 1, wherein the integrated management module further comprises:
means for, in response to determining that the particular signal is not used by the semiconductor chip, issuing an instruction to the semiconductor chip to enable the semiconductor chip.

10. The electronic system of claim 1, wherein the integrated management module further comprises:
means for, in response to determining that the particular signal is used by a functional logic within the semiconductor chip, issuing an instruction to the semiconductor chip to alter the functional logic within the semiconductor chip.

11. The electronic system of claim 10, wherein the functional logic provides means for accessing specific memory devices.

12. The electronic system of claim 10, wherein the semiconductor chip is on a board that is populated by other semiconductor chips, wherein the particular signal describes a temperature of the semiconductor chip, wherein the functional logic adjusts power usage on the semiconductor chip, and wherein the integrated management module further comprises:
means for receiving temperature readings from the other semiconductor chips; and
means for directing the functional logic, as altered by the integrated management module, to adjust the power usage on the semiconductor chip based on the temperature readings from the other semiconductor chips.

13. The electronic system of claim 1, wherein the integrated management module further comprises means for adjusting the functionality of the semiconductor chip by adjusting a configuration of the semiconductor chip.

14. An electronic system comprising:
a pin sensor; and
an integrated management module, wherein the integrated management module is configured to:
identify a location of a damaged connector between a semiconductor chip and a hardware socket, wherein the location of the damaged connector is described by a reading from the pin sensor, and wherein the damaged connector prevents a particular signal from being supplied to the semiconductor chip via the hardware socket;
identify the particular signal as an input for a particular semiconductor function;
determine whether the semiconductor chip provides the particular semiconductor function;
adjust a use of the semiconductor chip based on whether or not the semiconductor chip uses the particular signal to provide the particular semiconductor function; and
in response to determining that the particular signal is used by a functional logic within the semiconductor chip, issue an instruction to the semiconductor chip to alter the functional logic within the semiconductor chip.

15. The electronic system of claim 14, wherein the integrated management module is further configured to:
in response to determining that the semiconductor chip uses the particular signal to provide the particular semiconductor function, issue an instruction to repair the damaged connector.

16. The electronic system of claim 14, wherein the integrated management module is further configured to:
in response to determining that the semiconductor chip uses the particular signal to provide the particular semiconductor function, issue an instruction to replace the hardware socket.

17. The electronic system of claim 14, wherein the integrated management module is further configured to:
in response to determining that the semiconductor chip uses the particular signal to provide the particular semiconductor function, disable the particular semiconductor function in the semiconductor chip.

18. The electronic system of claim 14, wherein the integrated management module is further configured to:
in response to determining that the particular signal is a null signal, issue an instruction to the semiconductor chip to enable the semiconductor chip.

19. The electronic system of claim 14, wherein the integrated management module is further configured to:
in response to determining that the particular signal is not used by the semiconductor chip, issue an instruction to the semiconductor chip to enable the semiconductor chip.

* * * * *